(12) United States Patent
Chen et al.

(10) Patent No.: US 12,034,099 B2
(45) Date of Patent: Jul. 9, 2024

(54) PIXEL STRUCTURE

(71) Applicant: Au Optronics Corporation, Hsinchu (TW)

(72) Inventors: Yi-Hong Chen, Hsinchu (TW); Chia-An Lee, Hsinchu (TW); Kuan-Heng Lin, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 478 days.

(21) Appl. No.: 17/517,678

(22) Filed: Nov. 3, 2021

(65) Prior Publication Data

US 2023/0083492 A1   Mar. 16, 2023

(30) Foreign Application Priority Data

Sep. 15, 2021   (TW) .................................. 110134304

(51) Int. Cl.
*H01L 33/38* (2010.01)
*H01L 33/50* (2010.01)
*H01L 33/62* (2010.01)

(52) U.S. Cl.
CPC ............ *H01L 33/382* (2013.01); *H01L 33/50* (2013.01); *H01L 33/62* (2013.01)

(58) Field of Classification Search
CPC ....... H01L 33/382; H01L 33/50; H01L 33/62; H01L 33/505; H01L 27/153; H01L 33/387; H01L 27/156
See application file for complete search history.

(56) References Cited

U.S. PATENT DOCUMENTS

| 2019/0165038 | A1 | 5/2019 | Chae et al. |
| 2019/0206927 | A1 | 7/2019 | Lee et al. |
| 2020/0328250 | A1 | 10/2020 | Chae et al. |
| 2021/0183941 | A1 | 6/2021 | Lee et al. |
| 2022/0173273 | A1* | 6/2022 | Lai .......................... H01L 33/20 |

FOREIGN PATENT DOCUMENTS

| CN | 109494216 | 3/2019 |
| CN | 110690248 | 1/2020 |
| CN | 110709995 | 1/2020 |

* cited by examiner

*Primary Examiner* — Kyoung Lee
(74) *Attorney, Agent, or Firm* — JCIPRNET

(57) ABSTRACT

A pixel structure, including a first semiconductor layer, a first active layer, a second semiconductor layer, a second active layer, a third semiconductor layer, and an electrode layer that are sequentially stacked, is provided. A first portion of the electrode layer is electrically connected to a first portion of the first semiconductor layer through a first opening of a first portion of the third semiconductor layer, a first opening of a first portion of the second active layer, a first opening of a first portion of the second semiconductor layer, and a first opening of a first portion of the first active layer. A second portion of the electrode layer is electrically connected to a second portion of the second semiconductor layer through a second opening of a second portion of the third semiconductor layer and a second opening of a second portion of the second active layer.

12 Claims, 7 Drawing Sheets

PIXEL STRUCTURE

CROSS-REFERENCE TO RELATED APPLICATION

This application claims the priority benefit of Taiwan application serial no. 110134304, filed on Sep. 15, 2021. The entirety of the above-mentioned patent application is hereby incorporated by reference herein and made a part of this specification.

BACKGROUND

Technical Field

The disclosure relates to a pixel structure.

Description of Related Art

The light emitting diode display panel includes a driving back plate and multiple light emitting diode elements transposed onto the driving back plate. Inheriting the characteristics of light emitting diodes, the light emitting diode display panel has advantages such as power saving, high efficiency, high brightness, and fast response time. In addition, compared to the organic light emitting diode display panel, the light emitting diode display panel has advantages such as easy color adjustment, long light emitting life, and no image burn-in. Therefore, the light emitting diode display panel is regarded as the next generation display technology.

Generally speaking, in order for the light emitting diode display panel to display a color image, the light emitting diode elements of the light emitting diode display panel include multiple first light emitting diode elements for displaying a first color, multiple second light emitting diode elements for displaying a second color, and multiple third light emitting diode elements for displaying a third color. However, the first light emitting diode elements, the second light emitting diode elements, and the third light emitting diode elements are formed by respectively using three growth substrates, and then transposed onto the driving back plate by respectively using multiple transposing actions, such that it is not easy to improve the yield, the cost, and the resolution of the light emitting diode display panel.

SUMMARY

The disclosure provides a pixel structure with good performance.

The pixel structure of the disclosure includes a first semiconductor layer, a first active layer, a second semiconductor layer, a second active layer, a third semiconductor layer, an electrode layer, and a driving back plate. The first semiconductor layer has a first portion and a second portion. The first active layer is disposed on the first semiconductor layer and has a first portion and a second portion. The first portion and the second portion of the first active layer are respectively disposed on the first portion and the second portion of the first semiconductor layer. The first portion of the first active layer has a first opening, and the first opening of the first portion of the first active layer overlaps with the first portion of the first semiconductor layer. The second semiconductor layer is disposed on the first active layer and has a first portion and a second portion. The first portion and the second portion of the second semiconductor layer are respectively disposed on the first portion and the second portion of the first active layer. The first portion of the second semiconductor layer has a first opening, and the first opening of the first portion of the second semiconductor layer overlaps with the first opening of the first portion of the first active layer. The second active layer is disposed on the second semiconductor layer and has a first portion and a second portion. The first portion and the second portion of the second active layer are respectively disposed on the first portion and the second portion of the second semiconductor layer. The first portion and the second portion of the second active layer respectively have a first opening and a second opening. The first opening of the first portion of the second active layer overlaps with the first opening of the first portion of the second semiconductor layer, and the second opening of the second portion of the second active layer overlaps with the second portion of the second semiconductor layer. The third semiconductor layer is disposed on the second active layer and has a first portion and a second portion. The first portion and the second portion of the third semiconductor layer are respectively disposed on the first portion and the second portion of the second active layer. The first portion and the second portion of the third semiconductor layer respectively have a first opening and a second opening. The first opening of the first portion of the third semiconductor layer overlaps with the first opening of the first portion of the second active layer, and the second opening of the second portion of the third semiconductor layer overlaps with the second opening of the second portion of the second active layer. The electrode layer is disposed on the third semiconductor layer and has a first portion, a second portion, and a third portion. The first portion of the electrode layer is electrically connected to the first portion of the first semiconductor layer through the first opening of the first portion of the third semiconductor layer, the first opening of the first portion of the second active layer, the first opening of the first portion of the second semiconductor layer, and the first opening of the first portion of the first active layer. The second portion of the electrode layer is electrically connected to the second portion of the second semiconductor layer through the second opening of the second portion of the third semiconductor layer and the second opening of the second portion of the second active layer, and the third portion of the electrode layer is electrically connected to the second portion of the third semiconductor layer. The first portion, the second portion, and the third portion of the electrode layer are electrically connected to the driving back plate.

In an embodiment of the disclosure, the first opening of the first portion of the second active layer and the first opening of the first portion of the third semiconductor layer further overlap with the first portion of the second semiconductor layer, the electrode layer further has a fourth portion, and the fourth portion of the electrode layer is electrically connected to the first portion of the second semiconductor layer through the first opening of the first portion of the third semiconductor layer and the first opening of the first portion of the second active layer.

In an embodiment of the disclosure, the pixel structure further includes a third active layer and a fourth semiconductor layer. The first semiconductor layer is disposed between the first active layer and the third active layer. The third active layer has a first portion and a second portion, and the first portion and the second portion of the first semiconductor layer are respectively disposed on the first portion and the second portion of the third active layer. The third active layer is disposed between the first semiconductor layer and the fourth semiconductor layer. The fourth semiconductor layer has a first portion and a second portion, and the first portion and the second portion of the third active layer are respectively disposed on the first portion and the second portion of the fourth semiconductor layer.

In an embodiment of the disclosure, the fourth semiconductor layer further has a third portion; the third active layer further has a third portion, disposed on the third portion of the fourth semiconductor layer; the first semiconductor layer further has a third portion, disposed on the third portion of the third active layer; the first active layer further has a third portion, disposed on the third portion of the first semiconductor layer; the second semiconductor layer further has a third portion, disposed on the third portion of the first active layer; the second active layer further has a third portion, disposed on the third portion of the second semiconductor layer; the third semiconductor layer further has a third portion, disposed on the third portion of the second active layer; the electrode layer further has a fifth portion, electrically connected to the third portion of the fourth semiconductor layer through a third opening of the third portion of the third semiconductor layer, a third opening of the third portion of the second active layer, a second opening of the third portion of the second semiconductor layer, a second opening of the third portion of the first active layer, a first opening of the third portion of the first semiconductor layer, and a first opening of the third portion of the third active layer.

In an embodiment of the disclosure, the electrode layer further has a sixth portion, electrically connected to the third portion of the first semiconductor layer through the third opening of the third portion of the third semiconductor layer, the third opening of the third portion of the second active layer, the second opening of the third portion of the second semiconductor layer, and the second opening of the third portion of the first active layer.

In an embodiment of the disclosure, the pixel structure further includes a first wavelength conversion pattern. The third portion of the fourth semiconductor layer is disposed between the third portion of the third active layer and the first wavelength conversion pattern. The first portion of the first active layer emits a first beam. The second portion of the second active layer emits a second beam. The third portion of the third active layer emits a third beam, and the third beam passes through the first wavelength conversion pattern to be converted into a fourth beam. The first beam, the second beam, and the fourth beam respectively have a first color, a second color, and a third color.

In an embodiment of the disclosure, the fourth semiconductor layer further has a fourth portion; the third active layer further has a fourth portion, disposed on the fourth portion of the fourth semiconductor layer; the first semiconductor layer further has a fourth portion, disposed on the fourth portion of the third active layer; the first active layer further has a fourth portion, disposed on the fourth portion of the first semiconductor layer; the second semiconductor layer further has a fourth portion, disposed on the fourth portion of the first active layer; the second active layer further has a fourth portion, disposed on the fourth portion of the second semiconductor layer; the third semiconductor layer further has a fourth portion, disposed on the fourth portion of the second active layer; the electrode layer further has a seventh portion, electrically connected to the fourth portion of the fourth semiconductor layer through a fourth opening of the fourth portion of the third semiconductor layer, a fourth opening of the fourth portion of the second active layer, a third opening of the fourth portion of the second semiconductor layer, a third opening of the fourth portion of the first active layer, a second opening of the fourth portion of the first semiconductor layer, and a second opening of the fourth portion of the third active layer.

In an embodiment of the disclosure, the electrode layer further has an eighth portion, electrically connected to the fourth portion of the first semiconductor layer through the fourth opening of the fourth portion of the third semiconductor layer, the fourth opening of the fourth portion of the second active layer, the third opening of the fourth portion of the second semiconductor layer, and the third opening of the fourth portion of the first active layer.

In an embodiment of the disclosure, the pixel structure further includes a second wavelength conversion pattern. The fourth portion of the fourth semiconductor layer is disposed between the fourth portion of the third active layer and the second wavelength conversion pattern. The first portion of the first active layer emits a first beam. The second portion of the second active layer emits a second beam. The fourth portion of the third active layer emits a fifth beam, and the fifth beam passes through the second wavelength conversion pattern to be converted into a sixth beam. The first beam, the second beam, and the sixth beam respectively have a first color, a second color, and a fourth color.

In an embodiment of the disclosure, the pixel structure further includes a first wavelength conversion pattern, disposed in the third opening of the third portion of the third semiconductor layer, the third opening of the third portion of the second active layer, the second opening of the third portion of the second semiconductor layer, and the second opening of the third portion of the first active layer. The first portion of the first active layer emits a first beam, the second portion of the second active layer emits a second beam, the third portion of the third active layer emits a third beam, the third beam passes through the first wavelength conversion pattern to be converted into a fourth beam, and the first beam, the second beam, and the fourth beam respectively have a first color, a second color, and a third color.

In an embodiment of the disclosure, the first portion of the first semiconductor layer and the second portion of the first semiconductor layer are directly connected, the first portion of the first active layer and the second portion of the first active layer are directly connected, the first portion of the second semiconductor layer and the second portion of the second semiconductor layer are directly connected, the first portion of the second active layer and the second portion of the second active layer are directly connected, and the first portion of the third semiconductor layer and the second portion of the third semiconductor layer are directly connected.

In an embodiment of the disclosure, the first portion of the electrode layer has a surface facing away from the first semiconductor layer, the surface of the first portion of the electrode layer and the first semiconductor layer have a first distance, the second portion of the electrode layer has a surface facing away from the first semiconductor layer, the surface of the second portion of the electrode layer and the first semiconductor layer have a second distance, the third portion of the electrode layer has a surface facing away from the first semiconductor layer, the surface of the third portion of the electrode layer and the first semiconductor layer have a third distance, and the first distance, the second distance, and the third distance are substantially equal.

DETAILED DESCRIPTION OF DISCLOSED EMBODIMENTS

Figure 1:
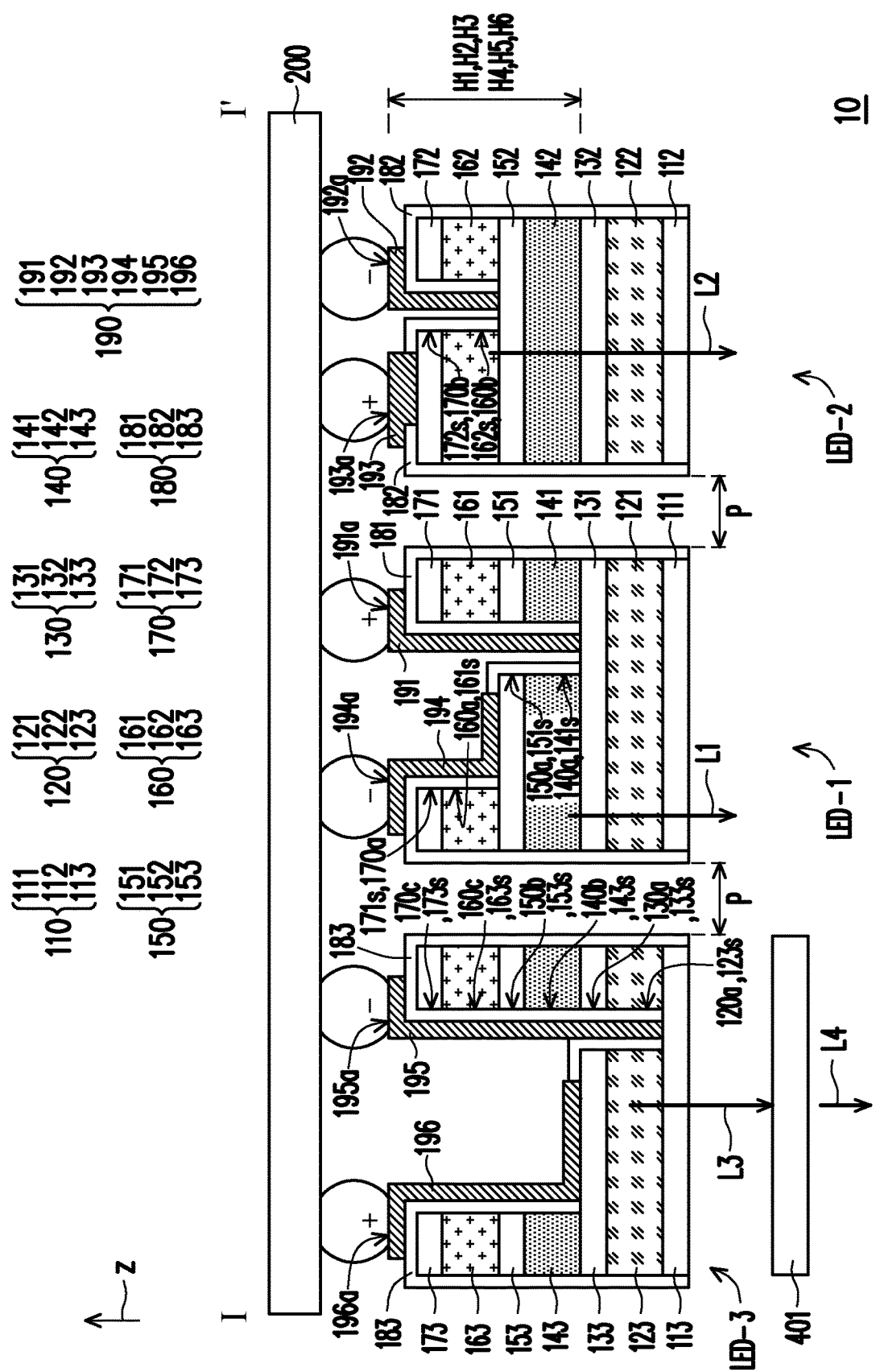
FIG. 1 is a schematic cross-sectional view of a pixel structure 10 according to an embodiment of the disclosure.

Reference will now be made in detail to the exemplary embodiments of the disclosure, and examples of the exemplary embodiments are illustrated in the accompanying drawings. Whenever possible, the same reference numerals are used in the drawings and description to indicate the same or similar parts.

It should be understood that when an element such as a layer, film, region, or substrate is referred to as being "on" or "connected to" another element, the layer, film, region, or substrate may be directly on or connected to the another element or there may be an intermediate element. In contrast, when an element is referred to as being "directly on" or "directly connected to" another element, there is no intermediate element. As used herein, "connection" may refer to physical and/or electrical connection. Furthermore, for "electrical connection" or "coupling", there may be another element between two elements.

As used herein, "about", "approximately", or "substantially" includes a stated value and an average value within an acceptable range of deviation from a specific value determined by persons skilled in the art, considering specific amounts of the measurement in question and measurement-related errors (that is, the limitation of the measurement system). For example, "about" may mean within one or more standard deviations or within ±30%, ±20%, ±10%, or ±5% of the stated value. Furthermore, a more acceptable range of deviation or standard deviation may be selected for "about", "approximately", or "substantially" used herein according to optical properties, etching properties, or other properties, instead of using one standard deviation for all properties.

Unless otherwise defined, all terms (including technical and scientific terms) used herein have the same meaning as commonly understood by persons skilled in the art to which the disclosure belongs. It will be further understood that terms such as those defined in commonly used dictionaries should be interpreted as having meanings consistent with their meanings in related technologies and the context of the disclosure, and will not be interpreted as having idealized or overly formal meanings, unless explicitly defined herein.

Figure 2:
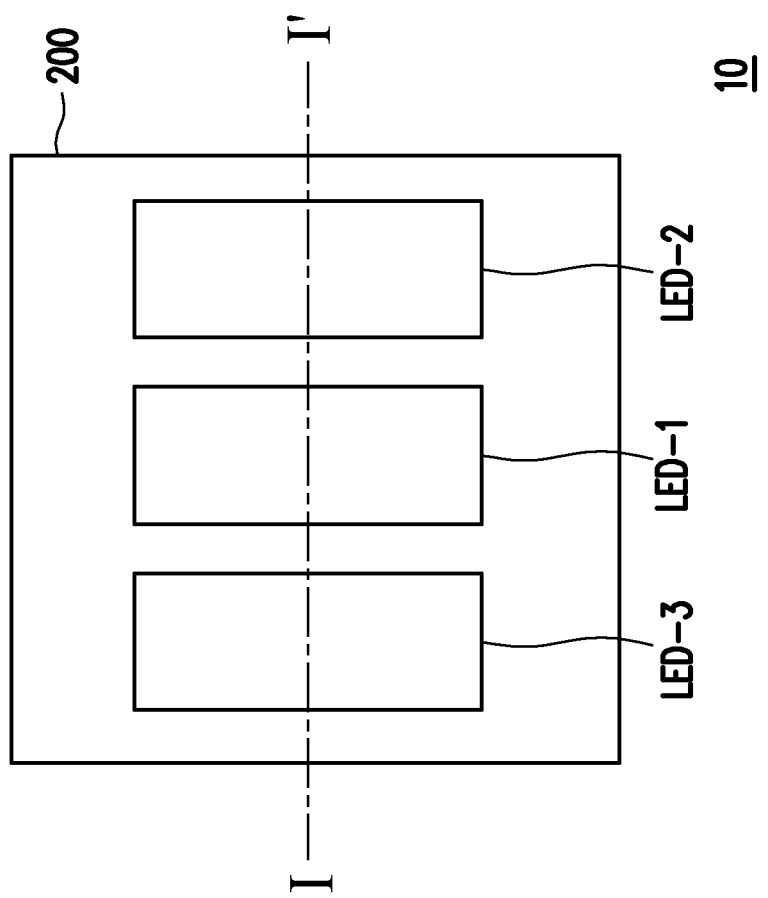
FIG. 2 is a schematic top view of the pixel structure 10 according to an embodiment of the disclosure.

FIG. 1 is a schematic cross-sectional view of a pixel structure 10 according to an embodiment of the disclosure. FIG. 2 is a schematic top view of the pixel structure 10 according to an embodiment of the disclosure. FIG. 1 corresponds to a section line I-I' of FIG. 2. FIG. 2 omits a first wavelength conversion pattern 401 of FIG. 1.

Please refer to FIG. 1. The pixel structure 10 includes a first semiconductor layer 130, a first active layer 140, a second semiconductor layer 150, a second active layer 160, a third semiconductor layer 170, and an electrode layer 190.

The first active layer 140 is disposed on the first semiconductor layer 130. The second semiconductor layer 150 is disposed on the first active layer 140. The second active layer 160 is disposed on the second semiconductor layer 150. The third semiconductor layer 170 is disposed on the second active layer 160. The electrode layer 190 is disposed on the third semiconductor layer 170.

The first semiconductor layer 130 has a first portion 131 and a second portion 132. The first active layer 140 has a first portion 141 and a second portion 142, which are respectively disposed on the first portion 131 and the second portion 132 of the first semiconductor layer 130. The first portion 141 of the first active layer 140 has a first opening 140a, and the first opening 140a overlaps with the first portion 131 of the first semiconductor layer 130. The second semiconductor layer 150 has a first portion 151 and a second portion 152, which are respectively disposed on the first portion 141 and the second portion 142 of the first active layer 140. The first portion 151 of the second semiconductor layer 150 has a first opening 150a, and the first opening 150a overlaps with the first opening 140a.

The second active layer 160 has a first portion 161 and a second portion 162, which are respectively disposed on the first portion 151 and the second portion 152 of the second semiconductor layer 150. The first portion 161 and the second portion 162 of the second active layer 160 respectively have a first opening 160a and a second opening 160b. The first opening 160a overlaps with the first opening 150a. The second opening 160b overlaps with the second portion 152 of the second semiconductor layer 150. The third semiconductor layer 170 has a first portion 171 and a second portion 172, which are respectively disposed on the first portion 161 and the second portion 162 of the second active layer 160. The first portion 171 and the second portion 172 of the third semiconductor layer 170 respectively have a first opening 170a and a second opening 170b. The first opening 170a overlaps with the first opening 160a, and the second opening 170b overlaps with the second opening 160b.

The electrode layer 190 has a first portion 191, a second portion 192, and a third portion 193. The first portion 191 of the electrode layer 190 is electrically connected to the first portion 131 of the first semiconductor layer 130 through the first opening 170a of the first portion 171 of the third semiconductor layer 170, the first opening 160a of the first portion 161 of the second active layer 160, the first opening 150a of the first portion 151 of the second semiconductor layer 150, and the first opening 140a of the first portion 141 of the first active layer 140. The second portion 192 of the electrode layer 190 is electrically connected to the second portion 152 of the second semiconductor layer 150 through the second opening 170b of the second portion 172 of the third semiconductor 170 and the second opening 160b of the second portion 162 of the second active layer 160. The third portion 193 of the electrode layer 190 is electrically connected to the second portion 172 of the third semiconductor layer 170. The first portion 191, the second portion 192, and the third portion 193 of the electrode layer 190 are electrically connected to the driving back plate 200.

In the embodiment, the first opening 160a of the first portion 161 of the second active layer 160 and the first opening 170a of the first portion 171 of the third semiconductor layer 170 further overlap with the first portion 151 of the second semiconductor layer 150. The electrode layer 190 further has a fourth portion 194. The fourth portion 194 is electrically connected to the first portion 151 of the second semiconductor layer 150 through the first opening 170a of the first portion 171 of the third semiconductor layer 170 and the first opening 160*a* of the first portion 161 of the second active layer 160. The fourth portion 194 of the electrode layer 190 is electrically connected to the driving back plate 200.

In the embodiment, the pixel structure 10 may further optionally include a third active layer 120 and a fourth semiconductor layer 110. The first semiconductor layer 130 is disposed between the first active layer 140 and the third active layer 120. The third active layer 120 is disposed between the first semiconductor layer 130 and the fourth semiconductor layer 110. In the embodiment, the fourth semiconductor layer 110, the third active layer 120, the first semiconductor layer 130, the first active layer 140, the second semiconductor layer 150, the second active layer 160, the third semiconductor layer 170, and the electrode layer 190 are sequentially stacked along a direction z perpendicular to the driving back plate 200.

In the embodiment, the third active layer 120 has a first portion 121 and a second portion 122. The first portion 131 and the second portion 132 of the first semiconductor layer 130 are respectively disposed on the first portion 121 and the second portion 122 of the third active layer 120. The fourth semiconductor layer 110 has a first portion 111 and a second portion 112, and the first portion 121 and the second portion 122 of the third active layer 120 are respectively disposed on the first portion 111 and the second portion 112 of the fourth semiconductor layer 110.

In the embodiment, the fourth semiconductor layer 110 further has a third portion 113. The third active layer 120 further has a third portion 123, which is disposed on the third portion 113 of the fourth semiconductor layer 110. The first semiconductor layer 130 further has a third portion 133, which is disposed on the third portion 123 of the third active layer 120. The first active layer 140 further has a third portion 143, which is disposed on the third portion 133 of the first semiconductor layer 130. The second semiconductor layer 150 further has a third portion 153, which is disposed on the third portion 143 of the first active layer 140. The second active layer 160 further has a third portion 163, which is disposed on the third portion 153 of the second semiconductor layer 150. The third semiconductor layer 170 further has a third portion 173, which is disposed on the third portion 163 of the second active layer 160.

In the embodiment, the electrode layer 190 further has a fifth portion 195, which is electrically connected to the third portion 113 of the fourth semiconductor layer 110 through a third opening 170*c* of the third portion 173 of the third semiconductor layer 170, a third opening 160*c* of the third portion 163 of the second active layer 160, a second opening 150*b* of the third portion 153 of the second semiconductor layer 150, a second opening 140*b* of the third portion 143 of the first active layer 140, a first opening 130*a* of the third portion 133 of the first semiconductor layer 130, and a first opening 120*a* of the third portion 123 of the third active layer 120. The fifth portion 195 of the electrode layer 190 is electrically connected to the driving back plate 200.

In the embodiment, the electrode layer 190 further has a sixth portion 196, which is electrically connected to the third portion 133 of the first semiconductor layer 130 through the third opening 170*c* of the third portion 173 of the third semiconductor layer 170, the third opening 160*c* of the third portion 163 of the second active layer 160, the second opening 150*b* of the third portion 153 of the second semiconductor layer 150, and the second opening 140*b* of the third portion 143 of the first active layer 140. The sixth portion 196 of the electrode layer 190 is electrically connected to the driving back plate 200.

In the embodiment, the pixel structure 10 further includes an insulating layer 180, wherein the fourth semiconductor layer 110, the third active layer 120, the first semiconductor layer 130, the first active layer 140, the second semiconductor layer 150, the second active layer 160, the third semiconductor layer 170, the insulating layer 180, and the electrode layer 190 are sequentially stacked along the direction z perpendicular to the driving back plate 200.

In the embodiment, the insulating layer 180 has a first portion 181, which is disposed on the first portion 171 of the third semiconductor layer 170. A side wall 171*s* of the first portion 171 of the third semiconductor layer 170 defines the first opening 170*a* of the first portion 171 of the third semiconductor layer 170. A side wall 161*s* of the first portion 161 of the second active layer 160 defines the first opening 160*a* of the first portion 161 of the second active layer 160. A side wall 151*s* of the first portion 151 of the second semiconductor layer 150 defines the first opening 150*a* of the first portion 151 of the second semiconductor layer 150. A side wall 141*s* of the first portion 141 of the first active layer 140 defines the first opening 140*a* of the first portion 141 of the first active layer 140. The first portion 181 of the insulating layer 180 is further disposed on the side walls 171*s*, 161*s*, 151*s*, and 141*s*, so that when the first portion 191 of the electrode layer 190 extends into the first openings 170*a*, 160*a*, 150*a*, and 140*a* to be electrically connected to the first portion 131 of the first semiconductor layer 130, the first portion 191 does not contact the third semiconductor layer 170, the second active layer 160, the second semiconductor layer 150, and the first active layer 140, and when the fourth portion 194 of the electrode layer 190 extends into the first openings 170*a* and 160*a* to be electrically connected to the first portion 151 of the second semiconductor layer 150, the fourth portion 194 does not contact the third semiconductor layer 170 and the second active layer 160.

In the embodiment, the insulating layer 180 further has a second portion 182, which is disposed on the second portion 172 of the third semiconductor layer 170. A side wall 172*s* of the second portion 172 of the third semiconductor layer 170 defines the second opening 170*b* of the second portion 172 of the third semiconductor layer 170. A side wall 162*s* of the second portion 162 of the second active layer 160 defines the second opening 160*b* of the second portion 162 of the second active layer 160. The second portion 182 of the insulating layer 180 is further disposed on the side walls 172*s* and 162*s*, so that when the second portion 192 of the electrode layer 190 extends into the second openings 170*b* and 160*b* to be electrically connected to the second portion 152 of the second semiconductor layer 150, the second portion 192 does not contact the third semiconductor layer 170 and the second active layer 160.

In the embodiment, the insulating layer 180 further has a third portion 183, which is disposed on the third portion 173 of the third semiconductor layer 170. A side wall 173*s* of the third portion 173 of the third semiconductor layer 170 defines the third opening 170*c* of the third portion 173 of the third semiconductor layer 170. A side wall 163*s* of the third portion 163 of the second active layer 160 defines the third opening 160*c* of the third portion 163 of the second active layer 160. A side wall 153*s* of the third portion 153 of the second semiconductor layer 150 defines the second opening 150*b* of the third portion 153 of the second semiconductor layer 150. A side wall 143*s* of the third portion 143 of the first active layer 140 defines the second opening 140*b* of the third portion 143 of the first active layer 140. A side wall 133*s* of the third portion 133 of the first semiconductor layer 130 defines the first opening 130*a* of the third portion 133 of the first semiconductor layer 130. A side wall 123s of the third portion 123 of the third active layer 120 defines the first opening 120a of the third portion 123 of the third active layer 120. The third portion 183 of the insulating layer 180 is further disposed on the side walls 173s, 163s, 153s, 143s, 133s, and 123s, so that when the fifth portion 195 of the electrode layer 190 extends into the third opening 170c, the third opening 160c, the second opening 150b, the second opening 140b, the first opening 130a, and the first opening 120a to be electrically connected to the third portion 113 of the fourth semiconductor layer 110, the fifth portion 195 does not contact the third semiconductor layer 170, the second active layer 160, the second semiconductor layer 150, the first active layer 140, the first semiconductor layer 130, and the third active layer 120, and when the sixth portion 196 of the electrode layer 190 extends into the third opening 170c, the third opening 160c, the second opening 150b, and the second opening 140b to be electrically connected to the third portion 133 of the first semiconductor layer 130, the sixth portion 196 does not contact the third semiconductor layer 170, the second active layer 160, the second semiconductor layer 150, and the first active layer 140.

Please refer to FIG. 1 and FIG. 2. In the embodiment, the first portion 111 of the fourth semiconductor layer 110, the first portion 121 of the third active layer 120, the first portion 131 of the first semiconductor layer 130, the first portion 141 of the first active layer 140, the first portion 151 of the second semiconductor layer 150, the first portion 161 of the second active layer 160, the first portion 171 of the third semiconductor layer 170, the first portion 181 of the insulating layer 180, and the first portion 191 and the fourth portion 194 of the electrode layer 190 may form a first light emitting element LED-1.

In the embodiment, the second portion 112 of the fourth semiconductor layer 110, the second portion 122 of the third active layer 120, the second portion 132 of the first semiconductor layer 130, the second portion 142 of the first active layer 140, the second portion 152 of the second semiconductor layer 150, the second portion 162 of the second active layer 160, the second portion 172 of the third semiconductor layer 170, the second portion 182 of the insulating layer 180, and the second portion 192 and the third portion 193 of the electrode layer 190 may form a second light emitting element LED-2.

In the embodiment, the third portion 113 of the fourth semiconductor layer 110, the third portion 123 of the third active layer 120, the third portion 133 of the first semiconductor layer 130, the third portion 143 of the first active layer 140, the third portion 153 of the second semiconductor layer 150, the third portion 163 of the second active layer 160, the third portion 173 of the third semiconductor layer 170, the third portion 183 of the insulating layer 180, and the fifth portion 195 and the sixth portion 196 of the electrode layer 190 may form a third light emitting element LED-3.

In the embodiment, the pixel structure 10 further includes a first wavelength conversion pattern 401, wherein the third portion 113 of the fourth semiconductor layer 110 is disposed between the third portion 123 of the third active layer 120 and the first wavelength conversion pattern 401. For example, in the embodiment, the first wavelength conversion pattern 401 may include at least one type of phosphor or a combination of a quantum dot material and a color filter layer, but the disclosure is not limited thereto.

In the embodiment, the driving back plate 200 may enable the first portion 141 of the first active layer 140 of the first light emitting element LED-1 to emit a first beam L1 through the first portion 191 and the fourth portion 194 of the electrode layer 190. The driving back plate 200 may enable the second portion 162 of the second active layer 160 of the second light emitting element LED-2 to emit a second beam L2 through the second portion 192 and the third portion 193 of the electrode layer 190. The driving back plate 200 may enable the third portion 123 of the third active layer 120 of the third light emitting element LED-3 to emit a third beam L3 through the fifth portion 195 and the sixth portion 196 of the electrode layer 190. The third beam L3 may pass through the first wavelength conversion pattern 401 to be converted into a fourth beam L4. The first beam L1, the second beam L2, and the fourth beam L4 respectively have different first color, second color, and third color.

For example, in the embodiment, the first active layer 140 is, for example, a first multiple quantum well layer that may emit blue light. The second active layer 160 is, for example, a second multiple quantum well layer that may emit green light. The third active layer 120 is, for example, a third multiple quantum well layer that may emit ultraviolet light. The first wavelength conversion pattern 401 may convert ultraviolet light into red light. The first beam L1 emitted by the first light emitting element LED-1 may be blue light. The second beam L2 emitted by the second light emitting element LED-2 may be green light. The fourth beam L4 converted from the third beam L3 emitted by the third light emitting element LED-3 may be red light. In other words, in the embodiment, the first color of the first beam L1, the second color of the second beam L2, and the third color of the fourth beam L4 may respectively be blue, green, and red, but the disclosure is not limited thereto.

In addition, in the embodiment, the fourth semiconductor layer 110, the first semiconductor layer 130, the second semiconductor layer 150, and the third semiconductor layer 170 are, for example, respectively a first-type semiconductor layer, a second-type semiconductor layer, a first-type semiconductor layer, and a second-type semiconductor layer. One of the first-type semiconductor layer and the second-type semiconductor layer is an n-type semiconductor, and the other one of the first-type semiconductor layer and the second-type semiconductor layer is a p-type semiconductor. One of the first portion 191 and the fourth portion 194 of the electrode layer 190 of the first light emitting element LED-1 is an anode of the first light emitting element LED-1, and the other one of the first portion 191 and the fourth portion 194 of the electrode layer 190 of the first light emitting element LED-1 is a cathode of the first light emitting element LED-1. One of the second portion 192 and the third portion 193 of the electrode layer 190 of the second light emitting element LED-2 is an anode of the second light emitting element LED-2, and the other one of the second portion 192 and the third portion 193 of the electrode layer 190 of the second light emitting element LED-2 is a cathode of the second light emitting element LED-2. One of the fifth portion 195 and the sixth portion 196 of the electrode layer 190 of the third light emitting element LED-3 is an anode of the third light emitting element LED-3, and the other one of the fifth portion 195 and the sixth portion 196 of the electrode layer 190 of the third light emitting element LED-3 is a cathode of the third light emitting element LED-3, but the disclosure is not limited thereto.

It is worth mentioning that during the manufacturing process of the pixel structure 10, a fourth semiconductor material layer (not shown), a third semiconductor material layer (not shown), a first semiconductor material layer (not shown), a first active material layer (not shown), a second semiconductor material layer (not shown), a second active material layer (not shown), and a third semiconductor material layer (not shown) are sequentially epitaxially grown on the same growth substrate (not shown). Then, the fourth semiconductor material layer, the third semiconductor material layer, the first semiconductor material layer, the first active material layer, the second semiconductor material layer, the second active material layer, and the third semiconductor material layer are patterned to form the fourth semiconductor layer 110 the third active layer 120, the first semiconductor layer 130, the first active layer 140, the second semiconductor layer 150, the second active layer 160, and the third semiconductor layer 170. Then, the insulating layer 180 and the electrode layer 190 are sequentially formed on the third semiconductor layer 170, thereby completing the first light emitting element LED-1, the second light emitting element LED-2, and the third light emitting element LED-3.

The first light emitting element LED-1, the second light emitting element LED-2, and the third light emitting element LED-3 are formed on the same growth substrate (not shown). Therefore, the first light emitting element LED-1, the second light emitting element LED-2, and the third light emitting element LED-3 may be transposed onto the driving back plate 200 in the same transposing action, instead of using multiple transposing actions to respectively transpose the first light emitting element LED-1, the second light emitting element LED-2, and the third light emitting element LED-3 for emitting different colors of the first beam L1, the second beam L2, and the third beam L3 onto the driving back plate 200. As such, the number of transpositions required to form the pixel structure 10 may be reduced. More importantly, a spacing P between the first light emitting element LED-1, the second light emitting element LED-2, and the third light emitting element LED-3 is no longer limited by the accuracy of the transposing action, thereby improving the resolution of a display device including the pixel structure 10.

Please refer to FIG. 1. In the embodiment, the first portion 191 of the electrode layer 190 has a surface 191a facing away from the first semiconductor layer 130. The surface 191a of the first portion 191 of the electrode layer 190 and the first semiconductor layer 130 have a first distance H1. The second portion 192 of the electrode layer 190 has a surface 192a facing away from the first semiconductor layer 130. The surface 192a of the second portion 192 of the electrode layer 190 and the first semiconductor layer 130 have a second distance H2. The third portion 193 of the electrode layer 190 has a surface 193a facing away from the first semiconductor layer 130. The surface 193a of the third portion 193 of the electrode layer 190 and the first semiconductor layer 130 have a third distance H3. The fourth portion 194 of the electrode layer 190 has a surface 194a facing away from the first semiconductor layer 130. The surface 194a of the fourth portion 194 of the electrode layer 190 and the first semiconductor layer 130 have a fourth distance H4. The fifth portion 195 of the electrode layer 190 has a surface 195a facing away from the first semiconductor layer 130. The surface 195a of the fifth portion 195 of the electrode layer 190 and the first semiconductor layer 130 have a fifth distance H5. The sixth portion 196 of the electrode layer 190 has a surface 196a facing away from the first semiconductor layer 130. The surface 196a of the sixth portion 196 of the electrode layer 190 and the first semiconductor layer 130 have a sixth distance H6.

In the embodiment, after completing the fourth semiconductor layer 110, the third active layer 120, the first semiconductor layer 130, the first active layer 140, the second semiconductor layer 150, the second active layer 160, and the third semiconductor layer 170 that are sequentially stacked, the electrode layer 190 is formed on the third semiconductor layer 170. Therefore, the first distance H1 of the surface 191a of the first portion 191 of the electrode layer 190 and the first semiconductor layer 130, the second distance H2 of the surface 192a of the second portion 192 of the electrode layer 190 and the first semiconductor layer 130, the third distance H3 of the surface 193a of the third portion 193 of the electrode layer 190 and the first semiconductor layer 130, the fourth distance H4 of the surface 194a of the fourth portion 194 of the electrode layer 190 and the first semiconductor layer 130, the fifth distance H5 of the surface 195a of the fifth portion 195 of the electrode layer 190 and the first semiconductor layer 130, and the sixth distance H6 of the surface 196a of the sixth portion 196 of the electrode layer 190 and the first semiconductor layer 130 may be substantially equal. The substantially equal first distance H1, second distance H2, third distance H3, fourth distance H4, fifth distance H5, and sixth distance H6 contribute to the first light emitting element LED-1, the second light emitting element LED-2, and the third light emitting device LED-3 being simultaneously transposed onto the driving back plate 200 and electrically connected to the driving back plate 200.

In the embodiment, the driving back plate 200 may include a substrate (not shown) and a first sub-pixel driving circuit (not shown), a second sub-pixel driving circuit (not shown), and a third sub-pixel driving circuit (not shown) disposed on the substrate. Each of the first sub-pixel driving circuit, the second sub-pixel driving circuit, and the third sub-pixel driving circuit may include a data line (not shown), a scan line (not shown), a power line (not shown), a common line (not shown), a first transistor (not shown), a second transistor (not shown), and a capacitor (not shown). A first terminal of the first transistor is electrically connected to the data line. A control terminal of the first transistor is electrically connected to the scan line. A second terminal of the first transistor is electrically connected to a control terminal of the second transistor. A first terminal of the second transistor is electrically connected to the power line. The capacitor is electrically connected to the second terminal of the first transistor and the first terminal of the second transistor. The first portion 191 and the fourth portion 194 of the electrode layer 190 of the first light emitting element LED-1 may be electrically connected to a second terminal and a common line of the second transistor of the first sub-pixel driving circuit. The second portion 192 and the third portion 193 of the electrode layer 190 of the second light emitting element LED-2 may be electrically connected to the second terminal and the common line of the second transistor of the second sub-pixel driving circuit. The fifth portion 195 and the sixth portion 196 of the electrode layer 190 of the third light emitting element LED-3 may be electrically connected to the second terminal and the common line of the second transistor of the third sub-pixel driving circuit. However, the disclosure is not limited thereto.

It must be noted here that the following embodiments continue to use the reference numerals and some content of the foregoing embodiment, wherein the same reference numerals are adopted to represent the same or similar elements, and the description of the same technical content is omitted. For the description of the omitted parts, reference may be made to the foregoing embodiment, which will not be repeated in the following embodiments.

Figure 3:
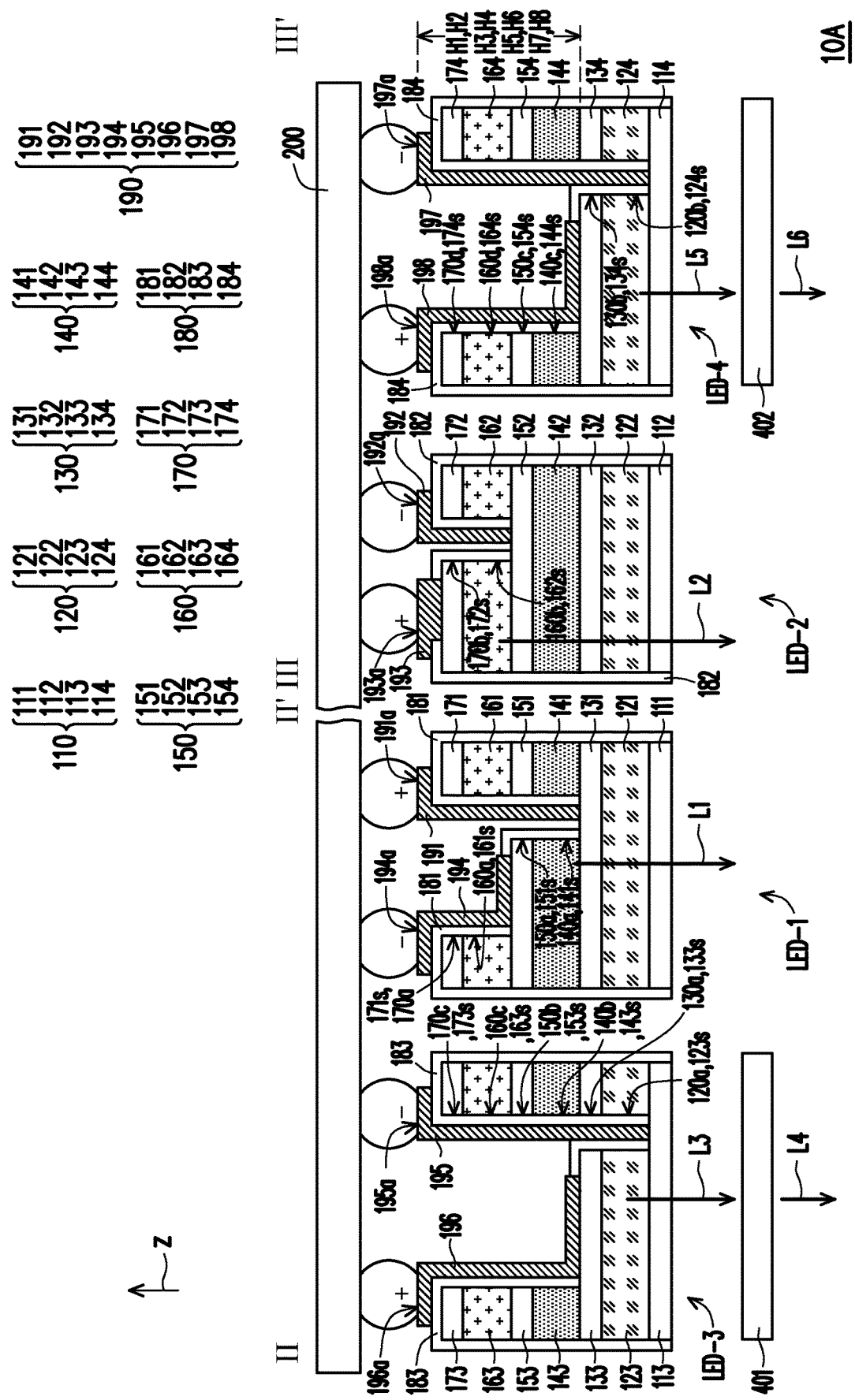
FIG. 3 is a schematic cross-sectional view of a pixel structure 10A according to an embodiment of the disclosure.
Figure 4:
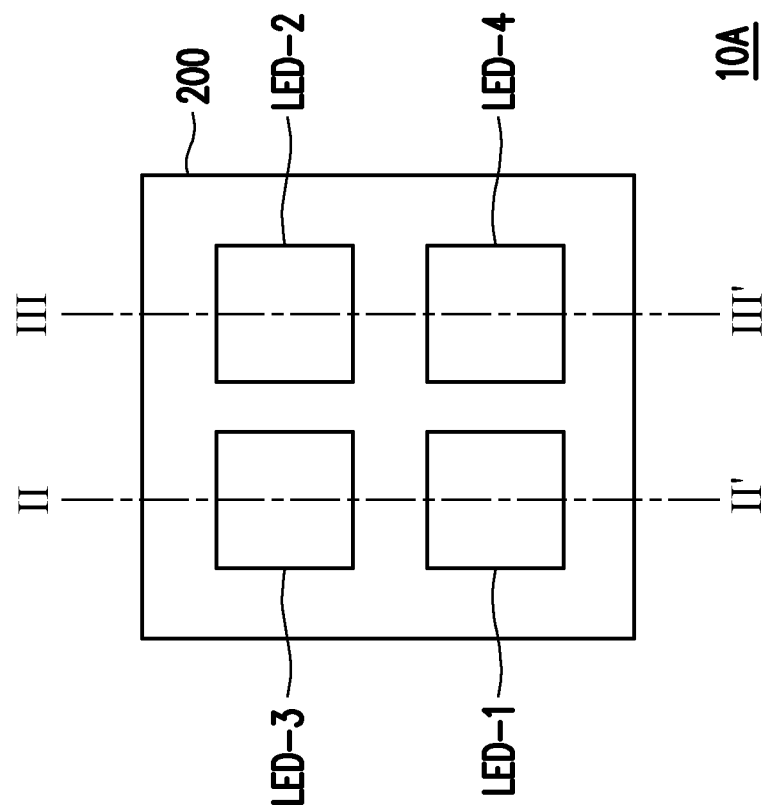
FIG. 4 is a schematic top view of the pixel structure 10A according to an embodiment of the disclosure.

FIG. 3 is a schematic cross-sectional view of a pixel structure 10A according to an embodiment of the disclosure. FIG. 4 is a schematic top view of the pixel structure 10A according to an embodiment of the disclosure. FIG. 3 corresponds to a section line II-II' and a section line III-III' of FIG. 4. FIG. 4 omits the first wavelength conversion pattern 401 of FIG. 1.

The pixel structure 10A of FIG. 3 and FIG. 4 is similar to the pixel structure 10 of FIG. 1 and FIG. 2, and the difference between the two is that the pixel structure 10A of FIG. 3 and FIG. 4 further includes a fourth light emitting element LED-4 and a second wavelength conversion pattern 402.

Please refer to FIG. 3. In the embodiment, the fourth semiconductor layer 110 further has a fourth portion 114. The third active layer 120 further has a fourth portion 124, which is disposed on the fourth portion 114 of the fourth semiconductor layer 110. The first semiconductor layer 130 further has a fourth portion 134, which is disposed on the fourth portion 124 of the third active layer 120. The first active layer 140 further has a fourth portion 144, which is disposed on the fourth portion 134 of the first semiconductor layer 130. The second semiconductor layer 150 further has a fourth portion 154, which is disposed on the fourth portion 144 of the first active layer 140. The second active layer 160 further has a fourth portion 164, which is disposed on the fourth portion 154 of the second semiconductor layer 150. The third semiconductor layer 170 further has a fourth portion 174, which is disposed on the fourth portion 164 of the second active layer 160.

In the embodiment, the electrode layer 190 further has a seventh portion 197, which is electrically connected to the fourth portion 114 of the fourth semiconductor layer 110 through a fourth opening 170d of the fourth portion 174 of the third semiconductor layer 170, a fourth opening 160d of the fourth portion 164 of the second active layer 160, a third opening 150c of the fourth portion 154 of the second semiconductor layer 150, a third opening 140c of the fourth portion 144 of the first active layer 140, a second opening 130b of the fourth portion 134 of the first semiconductor layer 130, and a second opening 120b of the fourth portion 124 of the third active layer 120. The seventh portion 197 of the electrode layer 190 is electrically connected to the driving back plate 200.

In the embodiment, the electrode layer 190 further has an eighth portion 198, which is electrically connected to the fourth portion 134 of the first semiconductor layer 130 through the fourth opening 170d of the fourth portion 174 of the third semiconductor layer 170, the fourth opening 160d of the fourth portion 164 of the second active layer 160, the third opening 150c of the fourth portion 154 of the second semiconductor layer 150, and the third opening 140c of the fourth portion 144 of the first active layer 140. The eighth portion 198 of the electrode layer 190 is electrically connected to the driving back plate 200.

In the embodiment, the insulating layer 180 further has a fourth portion 184, which is disposed on the fourth portion 174 of the third semiconductor layer 170. A side wall 174s of the fourth portion 174 of the third semiconductor layer 170 defines the fourth opening 170d of the fourth portion 174 of the third semiconductor layer 170. A side wall 164s of the fourth portion 164 of the second active layer 160 defines the fourth opening 160d of the fourth portion 164 of the second active layer 160. A side wall 154s of the fourth portion 154 of the second semiconductor layer 150 defines the third opening 150c of the fourth portion 154 of the second semiconductor layer 150. A side wall 144s of the fourth portion 144 of the first active layer 140 defines the third opening 140c of the fourth portion 144 of the first active layer 140. A side wall 134s of the fourth portion 134 of the first semiconductor layer 130 defines the second opening 130b of the fourth portion 134 of the first semiconductor layer 130. A side wall 124s of the fourth portion 124 of the third active layer 120 defines the second opening 120b of the fourth portion 124 of the third active layer 120. The fourth portion 184 of the insulating layer 180 is further disposed on the side walls 174s, 164s, 154s, 144s, 134s, and 124s, so that when the seventh portion 197 of the electrode layer 190 extends into the fourth opening 170d, the fourth opening 160d, the third opening 150c, the third opening 140c, the second opening 130b, and the second opening 120b to be electrically connected to the fourth portion 114 of the fourth semiconductor layer 110, the seventh portion 197 does not contact the third semiconductor layer 170, the second active layer 160, the second semiconductor layer 150, the first active layer 140, the first semiconductor layer 130, and the third active layer 120, and when the eighth portion 198 of the electrode layer 190 extends into the fourth opening 170d, the fourth opening 160d, the third opening 150c, and the third opening 140c to be electrically connected to the fourth portion 134 of the first semiconductor layer 130, the eighth portion 198 does not contact the third semiconductor layer 170, the second active layer 160, the second semiconductor layer 150, and the first active layer 140.

Please refer to FIG. 3 and FIG. 4. In the embodiment, the fourth portion 114 of the fourth semiconductor layer 110, the fourth portion 124 of the third active layer 120, the fourth portion 134 of the first semiconductor layer 130, the fourth portion 144 of the first active layer 140, the fourth portion 154 of the second semiconductor layer 150, the fourth portion 164 of the second active layer 160, the fourth portion 174 of the third semiconductor layer 170, the fourth portion 184 of the insulating layer 180, the seventh portion 197 and the eighth portion 198 of the electrode layer 190 may form the fourth light emitting element LED-4.

In the embodiment, the pixel structure 10A further includes the second wavelength conversion pattern 402, wherein the fourth portion 114 of the fourth semiconductor layer 110 is disposed between the fourth portion 124 of the third active layer 120 and the second wavelength conversion pattern 402. For example, in the embodiment, the second wavelength conversion pattern 402 may include at least one type of phosphor or a combination of a quantum dot material and a color filter layer, but the disclosure is not limited thereto.

In the embodiment, the driving back plate 200 may enable the first portion 141 of the first active layer 140 of the first light emitting element LED-1 to emit the first beam L1 through the first portion 191 and the fourth portion 194 of the electrode layer 190. The driving back plate 200 may enable the second portion 162 of the second active layer 160 of the second light emitting element LED-2 to emit the second beam L2 through the second portion 192 and the third portion 193 of the electrode layer 190. The driving back plate 200 may enable the third portion 123 of the third active layer 120 of the third light emitting element LED-3 to emit the third beam L3 through the fifth portion 195 and the sixth portion 196 of the electrode layer 190. The third beam L3 passes through the first wavelength conversion pattern 401 to be converted into the fourth beam L4. The fourth portion 124 of the third active layer 120 of the fourth light emitting element LED-4 emits a fifth beam L5. The fifth beam L5 passes through the second wavelength conversion pattern 402 to be converted into a sixth beam L6. The first beam L1, the second beam L2, the fourth beam L4, and the sixth beam L6 respectively have the first color, the second color, the third color, and a fourth color.

For example, in the embodiment, the first active layer 140 is, for example, the first multiple quantum well layer that may emit blue light. The second active layer 160 is, for example, the second multiple quantum well layer that may emit green light. The third active layer 120 is, for example, the third multiple quantum well layer that may emit ultraviolet light. The first wavelength conversion pattern 401 may convert ultraviolet light into red light. The second wavelength conversion pattern 402 may convert ultraviolet light into white light. The first beam L1 emitted by the first light emitting element LED-1 may be blue light. The second beam L2 emitted by the second light emitting element LED-2 may be green light. The fourth beam L4 converted from the third beam L3 emitted by the third light emitting element LED-3 may be red light. The sixth beam L6 converted from the fifth beam L5 emitted by the fourth light emitting element LED-4 may be white light. In other words, the first color of the first beam L1, the second color of the second beam L2, the third color of the fourth beam L4, and the fourth color of the sixth beam L6 may respectively be blue, green, red, and white, but the disclosure is not limited thereto.

In the embodiment, using the fourth light emitting element LED-4 and the second wavelength conversion pattern 402 enables the pixel structure 10A to be more capable of emitting white light, so that a display device including the pixel structure 10A can save power.

Please refer to FIG. 3. In the embodiment, the first portion 191 of the electrode layer 190 has the surface 191a facing away from the first semiconductor layer 130. The surface 191a of the first portion 191 of the electrode layer 190 and the first semiconductor layer 130 have the first distance H1. The second portion 192 of the electrode layer 190 has the surface 192a facing away from the first semiconductor layer 130. The surface 192a of the second portion 192 of the electrode layer 190 and the first semiconductor layer 130 have the second distance H2. The third portion 193 of the electrode layer 190 has the surface 193a facing away from the first semiconductor layer 130. The surface 193a of the third portion 193 of the electrode layer 190 and the first semiconductor layer 130 have the third distance H3. The fourth portion 194 of the electrode layer 190 has the surface 194a facing away from the first semiconductor layer 130. The surface 194a of the fourth portion 194 of the electrode layer 190 and the first semiconductor layer 130 have the fourth distance H4. The fifth portion 195 of the electrode layer 190 has the surface 195a facing away from the first semiconductor layer 130. The surface 195a of the fifth portion 195 of the electrode layer 190 and the first semiconductor layer 130 have the fifth distance H5. The sixth portion 196 of the electrode layer 190 has the surface 196a facing away from the first semiconductor layer 130. The surface 196a of the sixth portion 196 of the electrode layer 190 and the first semiconductor layer 130 have the sixth distance H6. The seventh portion 197 of the electrode layer 190 has a surface 197a facing away from the first semiconductor layer 130. The surface 197a of the seventh portion 197 of the electrode layer 190 and the first semiconductor layer 130 have a seventh distance H7. The eighth portion 198 of the electrode layer 190 has a surface 198a facing away from the first semiconductor layer 130. The surface 198a of the eighth portion 198 of the electrode layer 190 and the first semiconductor layer 130 have an eighth distance H8.

In the embodiment, after completing the fourth semiconductor layer 110, the third active layer 120, the first semiconductor layer 130, the first active layer 140, the second semiconductor layer 150, the second active layer 160, and the third semiconductor layer 170 that are sequentially stacked, the electrode layer 190 is formed on the third semiconductor layer 170. Therefore, the first distance H1 of the surface 191a of the first portion 191 of the electrode layer 190 and the first semiconductor layer 130, the second distance H2 of the surface 192a of the second portion 192 of the electrode layer 190 and the first semiconductor layer 130, the third distance H3 of the surface 193a of the third portion 193 of the electrode layer 190 and the first semiconductor layer 130, the fourth distance H4 of the surface 194a of the fourth portion 194 of the electrode layer 190 and the first semiconductor layer 130, the fifth distance H5 of the surface 195a of the fifth portion 195 of the electrode layer 190 and the first semiconductor layer 130, the sixth distance H6 of the surface 196a of the sixth portion 196 of the electrode layer 190 and the first semiconductor layer 130, the seventh distance H7 of the surface 197a of the seventh portion 197 of the electrode layer 190 and the first semiconductor layer 130, and the eighth distance H8 of the surface 198a of the eighth portion 198 of the electrode layer 190 and the first semiconductor layer 130 may be substantially equal.

Figure 5:
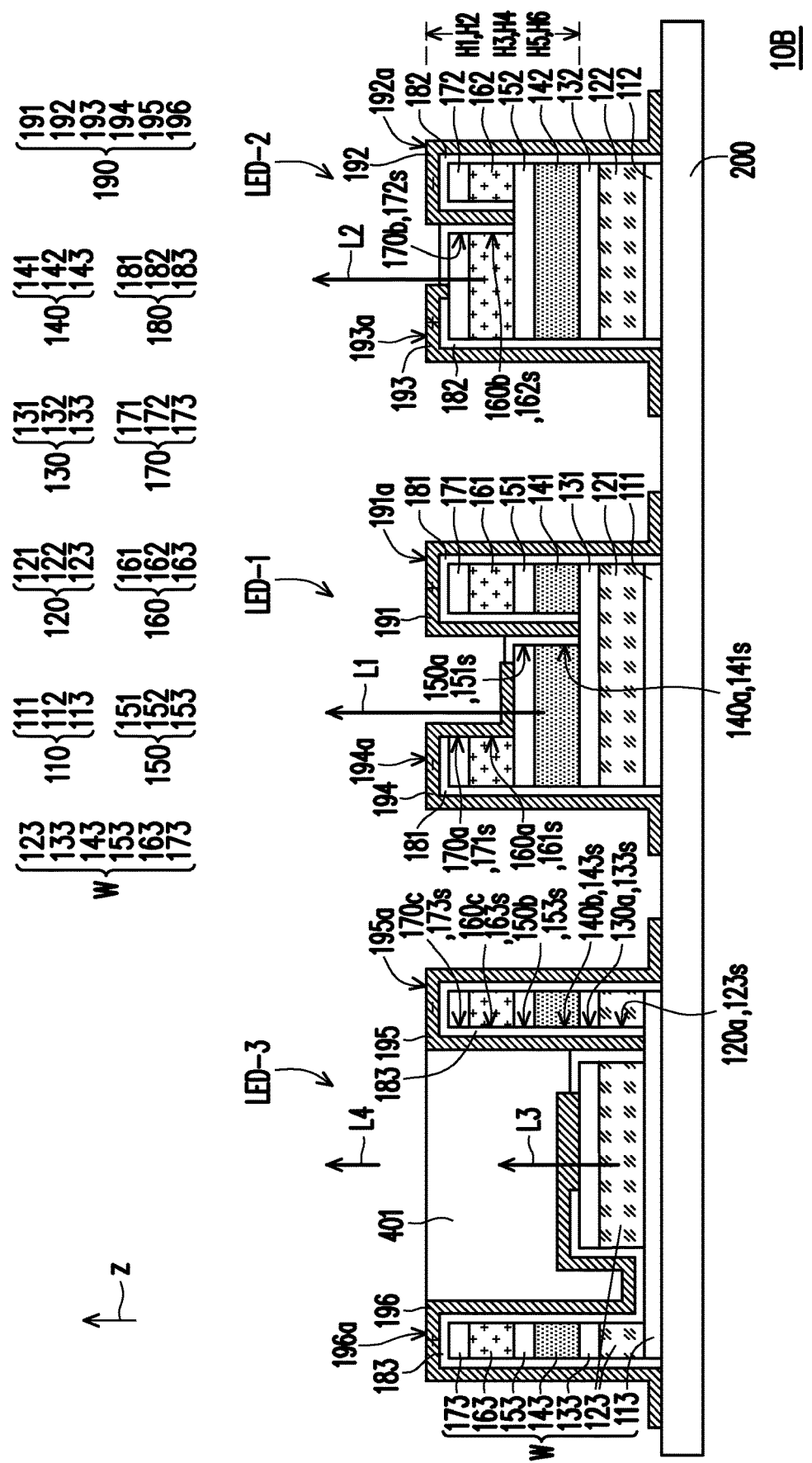
FIG. 5 is a schematic cross-sectional view of a pixel structure 10B according to an embodiment of the disclosure.
Figure 6:
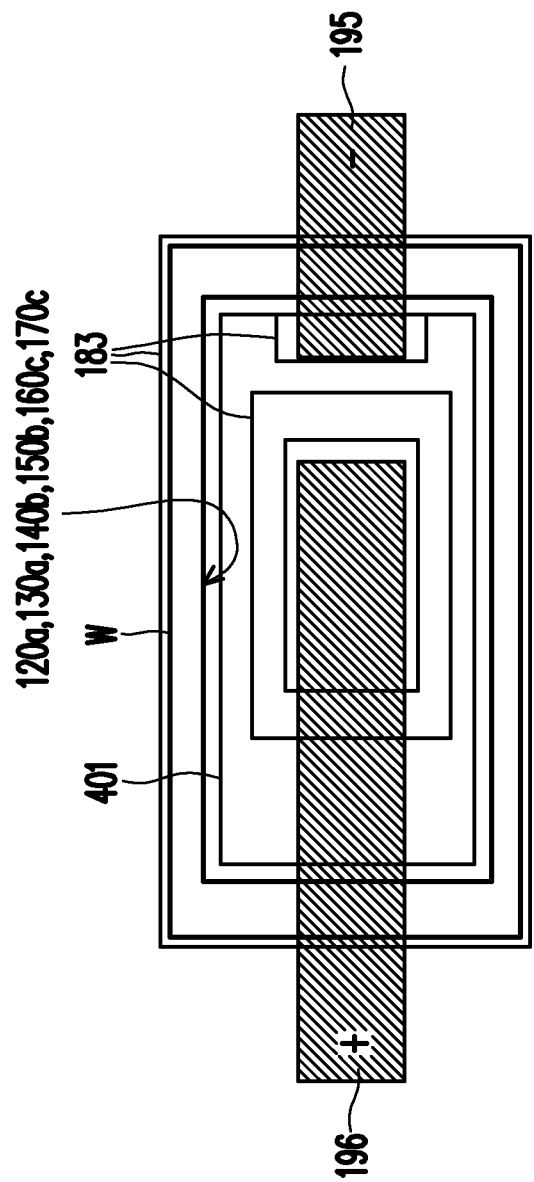
FIG. 6 is a schematic top view of a third light emitting element LED-3 and a first wavelength conversion pattern 401 of FIG. 5.

FIG. 5 is a schematic cross-sectional view of a pixel structure 10B according to an embodiment of the disclosure. FIG. 6 is a schematic top view of the third light emitting element LED-3 and the first wavelength conversion pattern 401 of FIG. 5.

The pixel structure 10B of the embodiment is similar to the pixel structure 10 of the foregoing embodiment, and the difference between the two is that the position of the first wavelength conversion pattern 401 of the pixel structure 10B of the embodiment is different from the position of the first wavelength conversion pattern 401 of the pixel structure 10 of the foregoing embodiment.

Please refer to FIG. 5 and FIG. 6. Specifically, in the embodiment, the first wavelength conversion pattern 401 is disposed in the third opening 170c of the third portion 173 of the third semiconductor layer 170, the third opening 160c of the third portion 163 of the second active layer 160, the second opening 150b of the third portion 153 of the second semiconductor layer 150, and the second opening 140b of the third portion 143 of the first active layer 140.

From another perspective, in the embodiment, the third opening 170c of the third portion 173 of the third semiconductor layer 170, the third opening 160c of the third portion 163 of the second active layer 160, the second opening 150b of the third portion 153 of the second semiconductor layer 150, and the second opening 140b of the third portion 143 of the first active layer 140 overlap. The third portion 173 of the third semiconductor layer 170 having the third opening 170c, the third portion 163 of the second active layer 160 having the third opening 160c, the third portion 153 of the second semiconductor layer 150 having the second opening 150b, and the third portion 143 of the first active layer 140 having the second opening 140b may be stacked into a wall structure W, and the first wavelength conversion pattern 401 is disposed in the wall structure W.

In the embodiment, the first wavelength conversion pattern 401 may be further optionally disposed in the first opening 130a of the third portion 133 of the first semiconductor layer 130 and the first opening 120a of the third portion 123 of the third active layer 120. In the embodiment, the wall structure W further includes the third portion 133 of the first semiconductor layer 130 having the first opening 130a and the third portion 123 of the third active layer 120 having the first opening 120a, and the first wavelength conversion pattern 401 may be disposed in the wall structure W formed by stacking the third portion 123 of the third active layer 120, the third portion 133 of the first semiconductor layer 130, the third portion 143 of the first active layer 140, the third portion 153 of the second semiconductor layer 150, the third portion 163 of the second active layer 160, and the third portion 173 of the third semiconductor layer 170.

Figure 7:
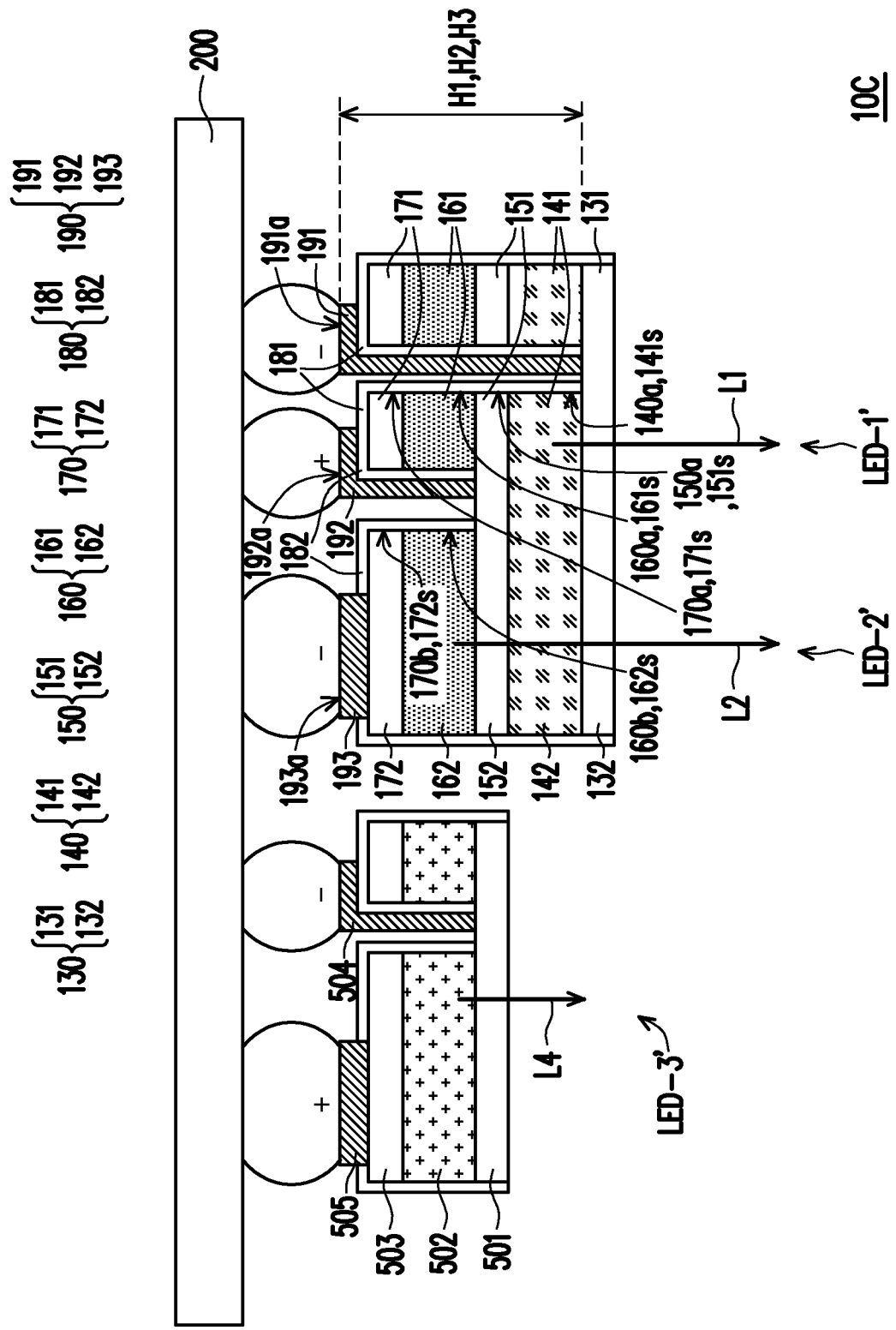
FIG. 7 is a schematic cross-sectional view of a pixel structure 10C according to an embodiment of the disclosure.

FIG. 7 is a schematic cross-sectional view of a pixel structure 10C according to an embodiment of the disclosure.

The pixel structure 10C of FIG. 7 is similar to the pixel structure 10 of FIG. 1, and the difference between the two is that a first light emitting element LED-1', a second light emitting element LED-2', and a third light emitting element LED-3' of FIG. 7 are different from the first light emitting element LED-1, the second light emitting element LED-2, and the third light emitting element LED-3 of FIG. 1.

Please refer to FIG. 1 and FIG. 7. Specifically, the first light emitting element LED-1' of FIG. 7 does not include the first portion 121 of the third active layer 120 and the first portion 111 of the fourth semiconductor layer 110 of the first light emitting element LED-1 of FIG. 1, and the second light emitting element LED-2' of FIG. 7 does not include the second portion 122 of the third active layer 120 and the second portion 112 of the fourth semiconductor layer 110 of the second light emitting element LED-2 of FIG. 1.

Please refer to FIG. 7. In the embodiment, the first portion 131 of the first semiconductor layer 130 of the first light emitting element LED-1' and the second portion 132 of the first semiconductor layer 130 of the second light emitting element LED-2' are directly connected. The first portion 141 of the first active layer 140 of the first light emitting element LED-1' and the second portion 142 of the first active layer 140 of the second light emitting element LED-2' are directly connected. The first portion 151 of the second semiconductor layer 150 of the first light emitting element LED-1' and the second portion 152 of the second semiconductor layer 150 of the second light emitting element LED-2' are directly connected. The first portion 161 of the second active layer 160 of the first light emitting element LED-1' and the second portion 162 of the second active layer 160 of the second light emitting element LED-2' are directly connected. The first portion 171 of the third semiconductor layer 170 of the first light emitting element LED-1' and the second portion 172 of the third semiconductor layer 170 of the second light emitting element LED-2' are directly connected.

In the embodiment, the second portion 192 of the electrode layer 190 is not only electrically connected to the second portion 152 of the second semiconductor layer 150 of the second light emitting element LED-2', but also electrically connected to the first portion 151 of the second semiconductor layer 150 of the first light emitting element LED-1'. In the embodiment, the second portion 192 of the electrode layer 190 may be used as a common anode (or cathode) of the first light emitting element LED-1' and the second light emitting element LED-2'.

In addition, in the embodiment, the third light emitting element LED-3' is not epitaxially completed on the same growth substrate (not shown) as the first light emitting element LED-1' and the second light emitting element LED-2'. The third light emitting element LED-3' is separately manufactured from the first light emitting element LED-1' and the second light emitting element LED-2'. During the manufacturing process of the pixel structure 10C, the first light emitting element LED-1' and the second light emitting element LED-2' may be transposed onto the driving back plate 200 in the same transposing action, and the third light emitting element LED-3' is transposed onto the driving back plate 200 in another transposing action.

Specifically, in the embodiment, the third light emitting element LED-3' includes a fifth semiconductor layer 501, a sixth semiconductor layer 503, a fourth active layer 502 disposed between the fifth semiconductor layer 501 and the sixth semiconductor layer 503, and a first electrode 504 electrically connected to the fifth semiconductor layer 501, and a second electrode 505 electrically connected to the sixth semiconductor layer 503, wherein one of the fifth semiconductor layer 501 and the sixth semiconductor layer 503 is the first-type semiconductor layer, and the other one of the fifth semiconductor layer 501 and the sixth semiconductor layer 503 is the second-type semiconductor layer different from the first-type semiconductor layer. The fifth semiconductor layer 501 and the sixth semiconductor layer 503 of the third light emitting element LED-3' do not belong to the same film layer as the first semiconductor layer 130, the second semiconductor layer 150, and the third semiconductor layer 170 of the first light emitting element LED-1' and the second light emitting element LED-2'. The fourth active layer 502 of the third light emitting element LED-3' does not belong to the same film layer as the first active layer 140 and the second active layer 160 of the first light emitting element LED-1' and the second light emitting element LED-2'. The first electrode 504 and the second electrode 505 of the third light emitting element LED-3' does not belong to the same film layer as the electrode layer 190 of the first light emitting element LED-1' and the second light emitting element LED-2'.

What is claimed is:

1. A pixel structure, comprising:
 a first semiconductor layer, having a first portion and a second portion;
 a first active layer, disposed on the first semiconductor layer and having a first portion and a second portion, wherein the first portion and the second portion of the first active layer are respectively disposed on the first portion and the second portion of the first semiconductor layer, the first portion of the first active layer has a first opening, and the first opening of the first portion of the first active layer overlaps with the first portion of the first semiconductor layer;
 a second semiconductor layer, disposed on the first active layer and having a first portion and a second portion, wherein the first portion and the second portion of the second semiconductor layer are respectively disposed on the first portion and the second portion of the first active layer, the first portion of the second semiconductor layer has a first opening, and the first opening of the first portion of the second semiconductor layer overlaps with the first opening of the first portion of the first active layer;
 a second active layer, disposed on the second semiconductor layer and having a first portion and a second portion, wherein the first portion and the second portion of the second active layer are respectively disposed on the first portion and the second portion of the second semiconductor layer, the first portion and the second portion of the second active layer respectively have a first opening and a second opening, the first opening of the first portion of the second active layer overlaps with the first opening of the first portion of the second semiconductor layer, and the second opening of the second portion of the second active layer overlaps with the second portion of the second semiconductor layer;
a third semiconductor layer, disposed on the second active layer and having a first portion and a second portion, wherein the first portion and the second portion of the third semiconductor layer are respectively disposed on the first portion and the second portion of the second active layer, the first portion and the second portion of the third semiconductor layer respectively have a first opening and a second opening, the first opening of the first portion of the third semiconductor layer overlaps with the first opening of the first portion of the second active layer, and the second opening of the second portion of the third semiconductor layer overlaps with the second opening of the second portion of the second active layer;
an electrode layer, disposed on the third semiconductor layer and having a first portion, a second portion, and a third portion, wherein the first portion of the electrode layer is electrically connected to the first portion of the first semiconductor layer through the first opening of the first portion of the third semiconductor layer, the first opening of the first portion of the second active layer, the first opening of the first portion of the second semiconductor layer, and the first opening of the first portion of the first active layer, the second portion of the electrode layer is electrically connected to the second portion of the second semiconductor layer through the second opening of the second portion of the third semiconductor layer and the second opening of the second portion of the second active layer, and the third portion of the electrode layer is electrically connected to the second portion of the third semiconductor layer; and
a driving back plate, wherein the first portion, the second portion, and the third portion of the electrode layer are electrically connected to the driving back plate.

2. The pixel structure according to claim 1, wherein the first opening of the first portion of the second active layer and the first opening of the first portion of the third semiconductor layer further overlap with the first portion of the second semiconductor layer, the electrode layer further has a fourth portion, and the fourth portion of the electrode layer is electrically connected to the first portion of the second semiconductor layer through the first opening of the first portion of the third semiconductor layer and the first opening of the first portion of the second active layer.

3. The pixel structure according to claim 1, further comprising:
a third active layer, wherein the first semiconductor layer is disposed between the first active layer and the third active layer, the third active layer has a first portion and a second portion, and the first portion and the second portion of the first semiconductor layer are respectively disposed on the first portion and the second portion of the third active layer; and
a fourth semiconductor layer, wherein the third active layer is disposed between the first semiconductor layer and the fourth semiconductor layer, the fourth semiconductor layer has a first portion and a second portion, and the first portion and the second portion of the third active layer are respectively disposed on the first portion and the second portion of the fourth semiconductor layer.

4. The pixel structure according to claim 3, wherein the fourth semiconductor layer further has a third portion; the third active layer further has a third portion, disposed on the third portion of the fourth semiconductor layer; the first semiconductor layer further has a third portion, disposed on the third portion of the third active layer; the first active layer further has a third portion, disposed on the third portion of the first semiconductor layer; the second semiconductor layer further has a third portion, disposed on the third portion of the first active layer; the second active layer further has a third portion, disposed on the third portion of the second semiconductor layer; the third semiconductor layer further has a third portion, disposed on the third portion of the second active layer; the electrode layer further has a fifth portion, electrically connected to the third portion of the fourth semiconductor layer through a third opening of the third portion of the third semiconductor layer, a third opening of the third portion of the second active layer, a second opening of the third portion of the second semiconductor layer, a second opening of the third portion of the first active layer, a first opening of the third portion of the first semiconductor layer, and a first opening of the third portion of the third active layer.

5. The pixel structure according to claim 4, wherein the electrode layer further has a sixth portion, electrically connected to the third portion of the first semiconductor layer through the third opening of the third portion of the third semiconductor layer, the third opening of the third portion of the second active layer, the second opening of the third portion of the second semiconductor layer, and the second opening of the third portion of the first active layer.

6. The pixel structure according to claim 4, further comprising:
a first wavelength conversion pattern, wherein the third portion of the fourth semiconductor layer is disposed between the third portion of the third active layer and the first wavelength conversion pattern, wherein
the first portion of the first active layer emits a first beam, the second portion of the second active layer emits a second beam, the third portion of the third active layer emits a third beam, the third beam passes through the first wavelength conversion pattern to be converted into a fourth beam, and the first beam, the second beam, and the fourth beam respectively have a first color, a second color, and a third color.

7. The pixel structure according to claim 4, wherein the fourth semiconductor layer further has a fourth portion; the third active layer further has a fourth portion, disposed on the fourth portion of the fourth semiconductor layer; the first semiconductor layer further has a fourth portion, disposed on the fourth portion of the third active layer; the first active layer further has a fourth portion, disposed on the fourth portion of the first semiconductor layer; the second semiconductor layer further has a fourth portion, disposed on the fourth portion of the first active layer; the second active layer further has a fourth portion, disposed on the fourth portion of the second semiconductor layer; the third semiconductor layer further has a fourth portion, disposed on the fourth portion of the second active layer; the electrode layer further has a seventh portion, electrically connected to the fourth portion of the fourth semiconductor layer through a fourth opening of the fourth portion of the third semiconductor layer, a fourth opening of the fourth portion of the second active layer, a third opening of the fourth portion of the second semiconductor layer, a third opening of the fourth portion of the first active layer, a second opening of the fourth portion of the first semiconductor layer, and a second opening of the fourth portion of the third active layer.

8. The pixel structure according to claim 7, wherein the electrode layer further has an eighth portion, electrically connected to the fourth portion of the first semiconductor layer through the fourth opening of the fourth portion of the third semiconductor layer, the fourth opening of the fourth portion of the second active layer, the third opening of the fourth portion of the second semiconductor layer, and the third opening of the fourth portion of the first active layer.

9. The pixel structure according to claim 7, further comprising:
   a second wavelength conversion pattern, wherein the fourth portion of the fourth semiconductor layer is disposed between the fourth portion of the third active layer and the second wavelength conversion pattern, wherein
   the first portion of the first active layer emits a first beam, the second portion of the second active layer emits a second beam, the fourth portion of the third active layer emits a fifth beam, the fifth beam passes through the second wavelength conversion pattern to be converted into a sixth beam, and the first beam, the second beam, and the sixth beam respectively have a first color, a second color, and a fourth color.

10. The pixel structure according to claim 4, further comprising:
   a first wavelength conversion pattern, disposed in the third opening of the third portion of the third semiconductor layer, the third opening of the third portion of the second active layer, the second opening of the third portion of the second semiconductor layer, and the second opening of the third portion of the first active layer, wherein
   the first portion of the first active layer emits a first beam, the second portion of the second active layer emits a second beam, the third portion of the third active layer emits a third beam, the third beam passes through the first wavelength conversion pattern to be converted into a fourth beam, and the first beam, the second beam, and the fourth beam respectively have a first color, a second color, and a third color.

11. The pixel structure according to claim 1, wherein the first portion of the first semiconductor layer and the second portion of the first semiconductor layer are directly connected, the first portion of the first active layer and the second portion of the first active layer are directly connected, the first portion of the second semiconductor layer and the second portion of the second semiconductor layer are directly connected, the first portion of the second active layer and the second portion of the second active layer are directly connected, and the first portion of the third semiconductor layer and the second portion of the third semiconductor layer are directly connected.

12. The pixel structure according to claim 1, wherein the first portion of the electrode layer has a surface facing away from the first semiconductor layer, the surface of the first portion of the electrode layer and the first semiconductor layer have a first distance, the second portion of the electrode layer has a surface facing away from the first semiconductor layer, the surface of the second portion of the electrode layer and the first semiconductor layer have a second distance, the third portion of the electrode layer has a surface facing away from the first semiconductor layer, the surface of the third portion of the electrode layer and the first semiconductor layer have a third distance, and the first distance, the second distance, and the third distance are substantially equal.

* * * * *